(12) United States Patent
Hsin

(10) Patent No.: US 6,791,842 B2
(45) Date of Patent: Sep. 14, 2004

(54) IMAGE SENSOR STRUCTURE

(75) Inventor: Chung Hsien Hsin, Hsinchu Hsien (TW)

(73) Assignee: Kingpak Technology Inc., Hsinchun Hsien (TW)

(*) Notice: Subject to any disclaimer, the term of this patent is extended or adjusted under 35 U.S.C. 154(b) by 52 days.

(21) Appl. No.: 10/292,981

(22) Filed: Nov. 12, 2002

(65) Prior Publication Data

US 2004/0089906 A1 May 13, 2004

(51) Int. Cl.[7] .......................... H05K 1/00; H05K 1/18; H05K 7/02; H05K 7/06; H05K 7/08
(52) U.S. Cl. .................. 361/748; 361/749; 361/760; 361/761; 361/773; 361/774; 257/431; 257/666; 257/668; 257/688; 257/693; 257/701; 257/703; 257/780; 257/784; 257/787
(58) Field of Search ................... 361/748, 749, 361/776, 772, 777, 760, 761, 773, 774; 257/431–434, 666, 667, 668, 688, 693, 701, 730, 780, 784, 787

(56) References Cited

U.S. PATENT DOCUMENTS

| | | | | |
|---|---|---|---|---|
| 4,984,059 A | * | 1/1991 | Kubota et al. | 257/676 |
| 5,073,008 A | * | 12/1991 | Terashita et al. | 359/589 |
| 5,545,913 A | * | 8/1996 | Quinn et al. | 257/443 |
| 5,859,423 A | * | 1/1999 | Shimoyama et al. | 250/214.1 |
| 6,287,890 B1 | * | 9/2001 | Ho | 438/106 |
| 6,310,421 B2 | * | 10/2001 | Morishima | 310/313 R |
| 6,577,342 B1 | * | 6/2003 | Wester | 348/340 |

* cited by examiner

*Primary Examiner*—Thanh Y. Tran
(74) *Attorney, Agent, or Firm*—Pro-Techtor International Services

(57) ABSTRACT

An image sensor includes a substrate, a frame layer, signal input terminals, a photosensitive chip, a transparent layer, a plurality of wires and a glue layer. The substrate has a first surface and a second surface. The frame layer is placed on the first surface to form a cavity together with the substrate. The signal input terminals are formed on the frame layer. The photosensitive chip has plural bonding pads, and is placed on the first surface of the substrate and positioned within the cavity. The transparent layer is placed over the frame layer to define, in the cavity, at least one exposure area through which the bonding pads of the photosensitive chip are exposed. The wires penetrate through the exposure area and electrically connect the bonding pads to the signal input terminals. The glue layer covers the exposure area to seal the plurality of wires.

4 Claims, 1 Drawing Sheet

IMAGE SENSOR STRUCTURE

BACKGROUND OF THE INVENTION

1. Field of the Invention

The invention relates to an image sensor structure.

2. Description of the Related Art

Referring to FIG. 1, a conventional image sensor includes a substrate 10, a frame layer 18, a photosensitive chip 26, a plurality of wires 28, and a transparent layer 34. The substrate 10 has a first surface 12 formed with signal input terminals 15, and a second surface 14 formed with signal output terminals 17 connected to BGA metallic balls 16, which are then electrically connected to a printed circuit board (not shown). The frame layer 18 has an upper surface 20 and a lower surface 22 bonded to the first surface 12 of the substrate 10 to form a cavity 24 together with the substrate 10. The photosensitive chip 26 is arranged within the cavity 24 formed by the substrate 10 and the frame layer 18 and is mounted on the first surface 12 of the substrate 10. Each of the plurality of wires 28 has a first terminal 30 electrically connected to the photosensitive chip 26, and a second terminal 32 electrically connected to a corresponding signal input terminal 15 of the substrate 10. The transparent layer 34 is placed on the upper surface 20 of the frame layer 18.

According to the above-mentioned structure, when the photosensitive chip 26 is made larger and plural wires 28 are to be bonded and electrically connected to the signal input terminals 15 of the substrate 10, the gap between the photosensitive chip 26 and the frame layer 18 will be reduced. If the designed gap is too small, the package processes cannot be performed. Therefore, when the photosensitive chip 26 is made larger, the substrate 10 has to be enlarged, which may not meet the miniaturized requirement of the product.

In view of the above-mentioned problems, it is an important object of the invention to provide an image sensor having a reduced volume and thus may be more practical.

SUMMARY OF THE INVENTION

An object of the invention is to provide an image sensor capable of facilitating the manufacturing processes and increasing the yield.

Another object of the invention is to provide an image sensor, which has a standard package volume and a photosensitive chip packed therein. The size of the chip may be changed without increasing the package volume of the image sensor.

Still another object of the invention is to provide an image sensor capable of simplifying the manufacturing processes and reducing the manufacturing costs, and thus making the image sensor more practical.

To achieve the above-mentioned objects, the invention provides an image sensor including a substrate, a frame layer, signal input terminals, a photosensitive chip, a transparent layer, a plurality of wires and a glue layer. The substrate has a first surface and a second surface opposite to the first surface. The frame layer is placed on the first surface of the substrate to form a cavity together with the substrate. The signal input terminals are formed on the frame layer. The photosensitive chip has plural bonding pads, and is placed on the first surface of the substrate and positioned within the cavity. The transparent layer is placed over the frame layer to define, in the cavity, at least one exposure area through which the bonding pads of the photosensitive chip are exposed. The wires penetrate through the at least one exposure area and electrically connect the bonding pads of the photosensitive chip to the signal input terminals on the frame layer. The glue layer covers the at least one exposure area to seal the plurality of wires. Thus, the above-mentioned image sensor may be manufactured easily and may be more practical.

The invention also provides another image sensor including a substrate, a frame layer, a photosensitive chip, a transfer medium, and a transparent layer placed over the frame layer. The substrate has a first surface and a second surface opposite to the first surface. The frame layer is placed on the first surface of the substrate to form a cavity together with the substrate. The photosensitive chip has plural bonding pads, and is placed on the first surface of the substrate and positioned within the cavity. The transfer medium is electrically connected to the bonding pads of the photosensitive chip for transferring signals from the photosensitive chip.

DETAILED DESCRIPTION OF THE INVENTION

Figure 1:
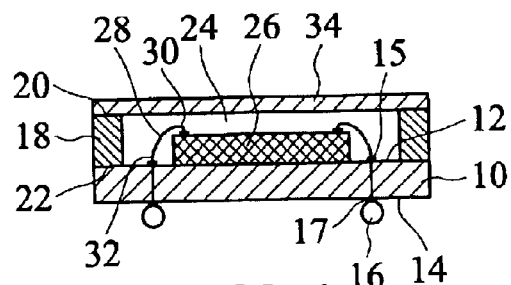
FIG. 1 is a schematic illustration showing a cross-sectional view of a conventional image sensor.
Figure 2:
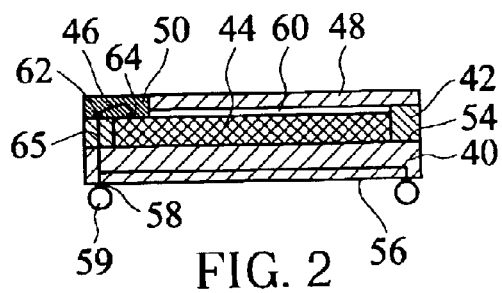
FIG. 2 is a schematic illustration showing a cross-sectional view of an image sensor according to a first embodiment of the invention.

Referring to FIG. 2, an image sensor according to a first embodiment of the invention includes a substrate 40, a frame layer 42, a photosensitive chip 44, a plurality of wires 46, a transparent layer 48 and a glue layer 50.

The substrate 40 has a first surface 54 and a second surface 56 opposite to the first surface 54. Signal output terminals 58 are formed on the second surface 56 for being electrically connected to a printed circuit board (not shown). In this embodiment, the signal output terminals 58 may be electrically connected to BGA (Ball Grid Array) metallic balls 59, which may be electrically connected to the printed circuit board.

The frame layer 42 is placed on the first surface 54 of the substrate 40 to form a cavity 60 together with the substrate 40. An upper edge of the frame layer 42 is formed with signal input terminals 62 electrically connected to signal output terminals 58 of the substrate 40, respectively. In this embodiment, the signal input terminals 62 are electrically connected to the signal output terminals 58 of the substrate 40 via the wires 65 penetrating through the frame layer 42 and the substrate 40.

The photosensitive chip 44 has a plurality of bonding pads 64 and is placed on the first surface 54 of the substrate 40 and positioned within the cavity 60.

The transparent layer 48 may be a piece of transparent glass having an area smaller than that of the cross section of the cavity 60. An exposure area is left when the transparent layer 48 is placed over the frame layer 42. Thus, the bonding pads 64 on the photosensitive chip 44 may be exposed from the exposure area.

The wires 46 in the exposure area electrically connects the plurality of bonding pads 64 of the photosensitive chip 44 to the signal input terminals 62 of the frame layer 42, respectively.

The glue layer 50 covers the exposure area to seal the plurality of wires 46.

Consequently, since the area of the transparent layer 48 is smaller than that of the cavity 60, the exposure area, which may contain the wires 46 electrically connected to the top of the frame layer 42, is formed after the transparent layer 48 is placed over the frame layer 42. Hence, the cavity 60 formed by the frame layer 42 and the substrate 40 may sufficiently accommodate the photosensitive chip 44 and no space for wire bonding has to be left in advance. Therefore, a larger photosensitive chip may be accommodated in a package with a predetermined size, and the wires 46 are free from be pressed by the transparent layer 48, thereby improving the manufacturing yield and facility.

Figure 3:
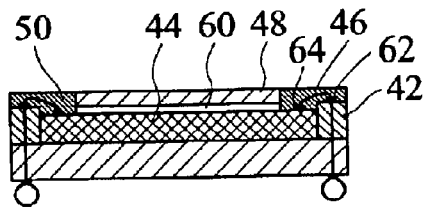
FIG. 3 is a schematic illustration showing a cross-sectional view of an image sensor according to a second embodiment of the invention.

Please refer to FIG. 3, which shows a second embodiment of the invention. When the bonding pads 64 of the photosensitive chip 44 are located at two sides, the area of the transparent layer 48 may be made small. When the transparent layer 48 is placed over the frame layer 42, exposure areas are formed at two sides of the cavity 60, and the bonding pads 64 on the photosensitive chip 44 are exposed from the two exposure areas. The wires 46 may be received in the two exposure areas to electrically connect the bonding pads 64 of the photosensitive chip 44 to the signal input terminals 62 of the frame layer 42, respectively.

Figure 4:
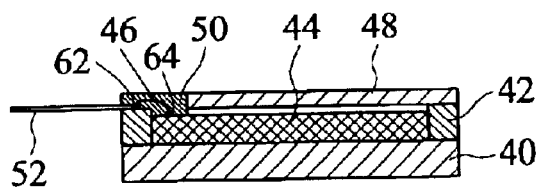
FIG. 4 is a schematic illustration showing a cross-sectional view of an image sensor according to a third embodiment of the invention.

Please refer to FIG. 4, which shows a third embodiment of the invention. The third embodiment is substantially the same as the first embodiment. The difference between the third and first embodiments resides in that no additional signal output terminals 58 have to be formed on the substrate 40. Instead, a transfer medium, which may be a flexible circuit board 52 in the third embodiment, is electrically connected to the signal input terminals 62 of the frame layer 42 by way of hot pressing. Therefore, signals from the photosensitive chip 44 may be transferred to the signal input terminals 62 on the frame layer 42 via the plurality of wires 46, and then be transferred out through the flexible circuit board 52. In addition, the glue layer 50 is provided to cover the exposure area so as to cover and seal the flexible circuit board 52 and the wires 46. According to this embodiment, the manufacturing processes for forming signal output terminals on the substrate 40 may be simplified and the manufacturing processes for forming the signal output terminals may be decreased. In addition, using the flexible circuit board 52 may cause the image sensor to be well electrically connected to the printed circuit board and may make the application of the image sensor more practical.

Figure 5:
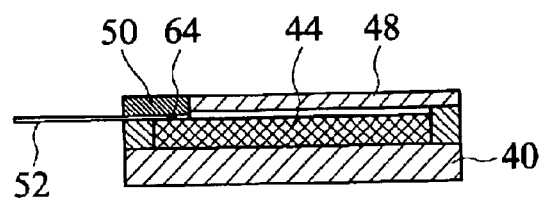
FIG. 5 is a schematic illustration showing a cross-sectional view of an image sensor according to a fourth embodiment of the invention.

Please refer to FIG. 5, which shows a fourth embodiment of the invention. In this embodiment, the flexible circuit board 52 is directly and electrically connected to the bonding pads 64 of the photosensitive chip 44 by way of hot pressing. Thus, signals from the photosensitive chip 44 may be directly transferred to the flexible circuit board 52 without any wire-bonding process in the overall package processes. According to such a design, the material cost of the wires 46 may be saved and the wire-bonding process may be omitted, thereby making the image sensor more practical.

According to the above-mentioned structure, the image sensor of the invention has the following advantages.

1. Since the area of the transparent layer 48 is smaller than that of the cavity 60, after the transparent layer 48 is placed over the frame layer 42, at least one exposure area is defined. The plurality of wires 46 may be received in the exposure area and electrically connected to the frame layer 42 without being pressed by the transparent layer 48. Thus, the manufacturing processes may be facilitated and the production yield may be increased.

2. Since the cavity 60 may sufficiently accommodate the photosensitive chip without a gap left between the frame layer 42 and the photosensitive chip 44, the package volume may be kept unchanged in packaging other photosensitive chips having different sizes.

3. Using the flexible circuit board 52 as the signal transfer medium for the photosensitive chip 44, the processes for manufacturing signal output terminals on the substrate 40 may be omitted.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An image sensor structure, comprising:
   a substrate having a first surface and a second surface opposite to the first surface;
   a frame layer placed on the first surface of the substrate to form a cavity together with the substrate;
   signal input terminals formed on the frame layer;
   a photosensitive chip having plural bonding pads, placed on the first surface of the substrate, and positioned within the cavity;
   a plurality of wires for electrically connecting the bonding pads of the photosensitive chip to the signal input terminals on the frame layer;
   a transfer medium electrically connected to the signal input terminals on the frame layer;
   a transparent layer placed over the frame layer; and
   a glue layer covering and sealing the transfer medium and the plurality of wires.

2. The image sensor according to claim 1, wherein when the transparent layer is placed over the frame layer, at least one exposure area is defined in the cavity, and the plurality of wires are received in the exposure area and electrically connect the bonding pads of the photosensitive chip to the signal input terminals on the frame layer.

3. The image sensor according to claims 1, wherein the transparent layer is a piece of transparent glass.

4. The image sensor according to claim 1, wherein the transfer medium is a flexible circuit board.

* * * * *